(12) United States Patent
Frijns et al.

(10) Patent No.: US 8,736,806 B2
(45) Date of Patent: May 27, 2014

(54) LITHOGRAPHIC APPARATUS, A RADIATION SYSTEM, A DEVICE MANUFACTURING METHOD AND A RADIATION GENERATING METHOD

(75) Inventors: Olav Waldemar Vladimir Frijns, 's-Hertogenbosch (NL); Johannes Christiaan Leonardus Franken, Knegsel (NL); Kurt Gielissen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 391 days.

(21) Appl. No.: 13/132,427

(22) PCT Filed: Oct. 8, 2009

(86) PCT No.: PCT/EP2009/063097
§ 371 (c)(1),
(2), (4) Date: Jun. 2, 2011

(87) PCT Pub. No.: WO2010/072429
PCT Pub. Date: Jul. 1, 2010

(65) Prior Publication Data
US 2011/0242516 A1 Oct. 6, 2011

Related U.S. Application Data

(60) Provisional application No. 61/139,905, filed on Dec. 22, 2008.

(51) Int. Cl.
*G03B 27/32* (2006.01)
*G03B 27/42* (2006.01)
*G03B 27/52* (2006.01)
*G03B 27/54* (2006.01)
*G03F 7/20* (2006.01)

(52) U.S. Cl.
CPC ................ *G03F 7/70916* (2013.01); *G03F 7/70033* (2013.01)
USPC .............. 355/30; 355/53; 355/67; 355/77

(58) Field of Classification Search
CPC ... G03F 7/70033; G03F 7/70916; H05G 2/00; H05G 2/006
USPC ............... 250/492.2; 355/30, 53, 67, 71, 77; 378/34
See application file for complete search history.

(56) References Cited

U.S. PATENT DOCUMENTS

| | | | |
|---|---|---|---|
| 7,161,653 B2 | 1/2007 | Bakker et al. | |
| 7,397,538 B2 | 7/2008 | Box et al. | |
| 7,485,881 B2 | 2/2009 | Wassink et al. | |
| 2006/0186353 A1* | 8/2006 | Wassink | 250/492.2 |
| 2007/0125968 A1 | 6/2007 | Klunder et al. | |
| 2008/0157006 A1 | 7/2008 | Wilhelmus Van Herpen et al. | |
| 2008/0212044 A1 | 9/2008 | Derra et al. | |
| 2011/0048452 A1 | 3/2011 | Zink et al. | |

FOREIGN PATENT DOCUMENTS

| | | |
|---|---|---|
| CN | 101218543 A | 7/2008 |
| EP | 1 677 149 A1 | 7/2006 |
| JP | 2006-191091 A | 7/2006 |
| JP | 2006-329664 A | 12/2006 |
| JP | 2007-194590 A | 8/2007 |
| JP | 2008-513995 A | 5/2008 |
| JP | 2008-277481 A | 11/2008 |
| WO | WO 2004/104707 A2 | 12/2004 |
| WO | WO 2007/051537 A2 | 5/2007 |
| WO | WO 2007/067039 A1 | 6/2007 |
| WO | WO 2007/114695 A1 | 10/2007 |
| WO | WO 2008/035965 A2 | 3/2008 |
| WO | WO 2008/069653 A1 | 6/2008 |
| WO | WO 2008/072959 A2 | 6/2008 |
| WO | WO 2008/072962 A2 | 6/2008 |
| WO | WO 2009/014439 A2 | 1/2009 |

OTHER PUBLICATIONS

International Search Report directed to related International Patent Application No. PCT/EP2009/063097, mailed Mar. 24, 2010, from the European Patent Office; 5 pages.
International Preliminary Report on Patentability with the Written Opinion of the International Searching Authority directed to related International Patent Application No. PCT/EP2009/063097, dated Jun. 29, 2011, from The International Bureau of WIPO; 8 pages.

* cited by examiner

*Primary Examiner* — Toan Ton
*Assistant Examiner* — Colin Kreutzer
(74) *Attorney, Agent, or Firm* — Sterne, Kessler, Goldstein & Fox P.L.L.C.

(57) ABSTRACT

A lithographic apparatus includes a radiation system for providing a beam of radiation from radiation emitted by a radiation source. The radiation system includes a contaminant trap for trapping material emanating from the radiation source. The rotation contaminant trap includes a multiple number of elements extending in a radial direction from a common rotation trap axis and being arranged for allowing contaminant material emanating from the radiation source to deposit during propagation of the radiation beam in the radiation system. The radiation system further includes a contaminant catch for receiving contaminant material particles from the rotation trap elements, the contaminant catch having a constitution, during operation of the radiation, for retaining said contaminant material particles.

12 Claims, 5 Drawing Sheets

LITHOGRAPHIC APPARATUS, A RADIATION SYSTEM, A DEVICE MANUFACTURING METHOD AND A RADIATION GENERATING METHOD

CROSS-REFERENCE TO RELATED APPLICATIONS

The present application is a National Stage Entry of International Application No. PCT/EP2009/06309 filed on Oct. 8, 2009, which claims priority to U.S. Provisional Application No. 61/139,905, filed on Dec. 22, 2008.

BACKGROUND

1. Field of the Invention

The present invention relates to a lithographic apparatus, a radiation system, a device manufacturing method and a radiation generating method.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

To image smaller features, it has been proposed to use extreme ultraviolet radiation (EUV) with a wavelength in the range of 5-20 nanometers, in particular, 13.5 nanometers, or a charged particle beam, e.g., an ion beam and an electron beam, as the exposure radiation in a lithographic apparatus. These types of radiation need the beam path in the apparatus to be evacuated to avoid absorption. Since there are no known materials for making a refractive optical element for EUV radiation, EUV lithographic apparatus use mirrors in the radiation, illumination and projection systems. Such mirrors are highly susceptible to contamination, thereby reducing their reflectivity and hence the throughput of the apparatus. Further, sources for EUV may produce debris whose entry into the illumination system should be avoided.

In order to reduce the chance of debris entering the illumination system, the use of contaminant traps is known. Such traps are disposed in the radiation system downstream the source. The traps comprise elements that provide a surface on which debris can deposit. Conventional radiation systems may also comprise a collector that collects the radiation beam. It has been found that debris may also deposit on elements in the collector. The deposit of debris on the collector significantly reduces its operational lifetime before it must be cleaned.

A rotation element trap is a specific contaminant trap type comprising a multiple number of elements extending in a radial direction from a common rotation trap axis. During operation of the lithographic apparatus, the rotation element trap rotates in the path of the radiation beam around the rotation trap axis thereby enabling the elements to catch contamination material, typically tin particles. It is also known to provide a ring shaped contaminant catch for receiving contaminant material particles that are ejected from the rotation element trap elements due to centrifugal forces. The received tin particles flow from the catch towards a tin collection vessel.

Another specific contamination trap type is a static element trap that may also be arranged in the path of the radiation beam, e.g., downstream to the rotation element trap.

It is further known to apply an Argon gas barrier in the rotation element trap to counteract an exponential decrease of the collector lifetime. In order to maintain the Argon gas barrier, a relatively small distance is present between the rotation element trap elements and the ring-shaped catch. However, Tin particles being in the liquid phase when traveling towards the catch tend to become solid particles when hitting the catch, thereby accumulating in the small space between the elements and the catch. In order to prevent the tin particles to solidify it is known to heat the catch so that the tin droplets may flow to the tin collection vessel. In practice, it appears that thermal shorts are created between the heated catch and a cooled static element trap arranged downstream to the rotating element trap. The thermal shorts may cause a drop in the catch temperature leading to a source interlock. Further it appears that the static element trap may crash due to the presence of tin droplets. Therefore, in order to counteract the above-mentioned effects, the tin particles must be frequently removed from the catch and from the static element trap thus causing an undesired increase in downtime of the radiation system.

SUMMARY

Therefore, what is needed is an effective system and method to reduce the occurrence of solidified tin particles in a radiation system without performing tin cleaning activities on a frequent or regular basis.

In an embodiment of the present invention, there is provided a lithographic apparatus comprising a radiation system for providing a beam of radiation from radiation emitted by a radiation source where the radiation system comprises a rotation contaminant trap arranged in the path of the radiation beam for trapping material emanating from the radiation source. The rotation contaminant trap comprises multiple elements extending in a radial direction from a common rotation trap axis and are arranged to allow contaminant material emanating from the radiation source to deposit during propagation of the radiation beam in the radiation system. The radiation system further comprises a contaminant catch for receiving contaminant material particles from the contaminant trap elements where the contaminant catch comprises a constitution, which during operation of the radiation system retains the contaminant material particles and an illumination system configured to condition the radiation beam with a support constructed to support a patterning device with the patterning device being capable of imparting the radiation beam with a pattern in its cross-section to form a patterned radiation beam. Further, the apparatus comprises a substrate table constructed to hold a substrate and a projection system configured to project the patterned radiation beam onto a target portion of the substrate.

In another embodiment of the present invention, there is provided a radiation system for providing a beam of radiation from radiation emitted by a radiation source where the radiation system comprises a rotation contaminant trap arranged in the path of the radiation beam for trapping material emanating from the radiation source. The rotation contaminant trap comprises multiple elements extending in a radial direction from a common rotation trap axis and are arranged to allow contaminant material emanating from the radiation source to deposit during propagation of the radiation beam in the radiation system. The radiation system further comprises a contaminant catch for receiving contaminant material particles from the contaminant trap elements where the contaminant catch comprises a constitution, which during operation of the radiation system retains the contaminant material particles.

In a further embodiment of the present invention, there is provided a device manufacturing method comprising providing a beam of radiation by a radiation system, from radiation emitted by a radiation source which provides the radiation system a rotation contaminant trap for trapping material emanating from the radiation source, in which the rotation contaminant trap comprises multiple elements extending in a radial direction from a common rotation trap axis and are arranged to allow contaminant material emanating from the radiation source to deposit during propagation of the radiation beam in the radiation system. The method continues by receiving contaminant material particles from the contaminant trap elements, where the contaminant catch comprises a constitution, which during operation of the radiation system retains the contaminant material particles. Furthermore, the method conditions the radiation beam while supporting a patterning device and imparting the radiation beam with a pattern in its cross-section using the patterning device to form a patterned radiation beam while holding a substrate on a substrate table and projecting the patterned radiation beam onto a target portion of the substrate.

In yet another embodiment of the present invention, there is provided a radiation generating method comprising providing a beam of radiation by a radiation system, from radiation emitted by a radiation source, and providing in the radiation system a contaminant trap for trapping material emanating from the radiation source, the rotation contaminant trap comprising a multiple number of elements extending in a radial direction from a common rotation trap axis and being arranged for allowing contaminant material emanating from the radiation source to deposit during propagation of the radiation beam in the radiation system. Further, the method provides a contaminant catch for receiving contaminant material particles from the contaminant trap elements, the contaminant catch having a constitution, which during operation of the radiation system, retains the contaminant material particles.

Further embodiments, features, and advantages of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which corresponding reference symbols indicate corresponding parts. Further, the accompanying drawings, which are incorporated herein and form part of the specification, illustrate the present invention and, together with the description, further serve to explain the principles of the invention and to enable a person skilled in the relevant art(s) to make and use the invention.

Figure 1:
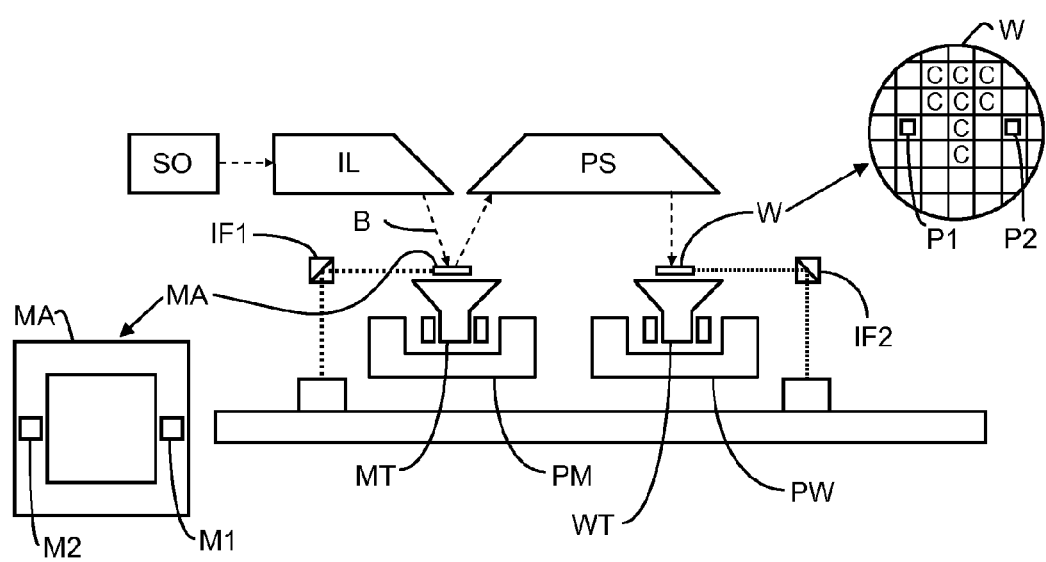
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

FIG. 1 schematically depicts a lithographic apparatus according to one embodiment of the invention. The apparatus comprises an illumination system (illuminator) IL configured to condition a radiation beam B (e.g., UV radiation or visible light radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist-coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g., employing a reflective mask). Alternatively, the apparatus may be of a transmissive type (e.g., employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
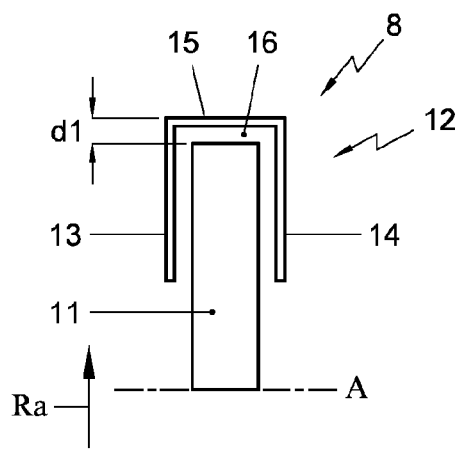
FIG. 2 depicts a schematic cross sectional view of a rotation contaminant trap section according to an embodiment of the invention.
Figure 3:
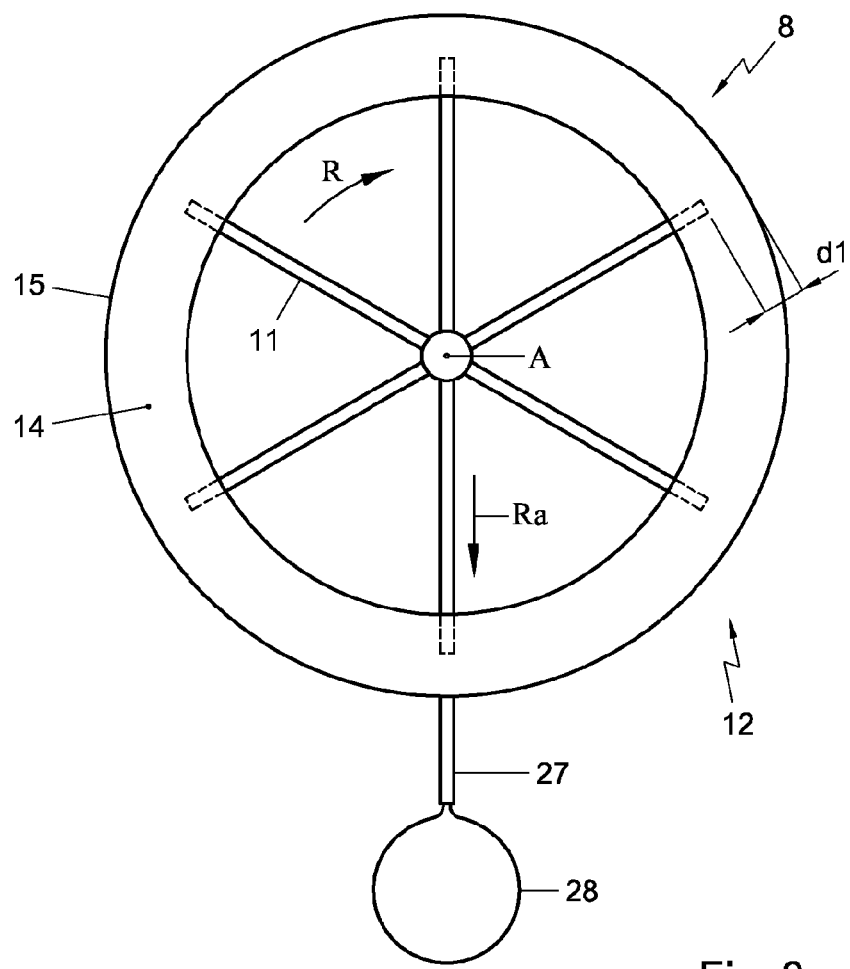
FIG. 3 depicts another schematic cross sectional view of the rotation contaminant trap of FIG. 2 according to an embodiment of the invention.

FIG. 2 depicts a schematic cross sectional view of a rotation contaminant trap section 8 of a radiation system. The radiation system is arranged for providing a beam of radiation from a radiation emitted by a radiation source SO. The radiation source SO can be formed by a discharge plasma. The radiation source SO can be of the EUV type and may a tin (Sn) based plasma source. Alternatively, the EUV type radiation source SO might use a gas or vapor, such as Xe gas or Li vapor. The radiation system 10 comprises a rotation contaminant trap 8, also called rotating element trap (RFT), arranged in the path of the radiation beam for trapping material emanating from the radiation source SO. Thereto, the contaminant trap 8 comprises a multiple number of elements 11 extending in a radial direction Ra from a common rotation trap axis A and being arranged in the path of the radiation beam on which the material emanating from the radiation source can deposit during propagation of the radiation beam in the radiation system. In FIG. 2, a cross section is shown viewing a plane wherein the common rotation trap axis A extends. FIG. 3 depicts another schematic cross sectional view of the known rotation contaminant trap section 8. Here, a cross section is shown viewing a plane transversely to the common rotation trap axis A.

The multiple elements 11 arranged in the path of the radiation beam may comprise metal platelets, also called foils or blades, to prevent debris, i.e., contaminant material, including particles, thrust by the source to reach optical components of the radiation system, e.g., a collector and the illuminator IL. The foils are arranged radially around the common rotation trap axis A.

The radiation system further comprises a contaminant catch 12 for receiving contaminant material particles from the RFT foils. The catch 12, also called gutter, comprises a profile surrounding radial end portions of the foils 11, the profile comprising side portions 13, 14 extending substantially mutually parallel and in the radial direction Ra with respect to the common rotation trap axis A. The profile further comprises a radial end portion 15 interconnecting the side portions 13, 14. The profile forms a ring-shaped open channel-like structure with the open side oriented radially inwardly, towards radial end portions of the RFT foils, see also FIG. 3. It is noted that one of the side portions 14 can be removed by maintaining a side portion facing the source.

During operation of the radiation system, contaminant particles emanating from the source may hit at least one of the multiple number of RFT elements. Further, an Argon gas pressure is applied in the RFT to catch contaminant particles. Due to the rotation of the RFT elements in the rotation direction R, the particles are driven radially outwardly towards the catch 12. The catch 12 is heated by a heating element (not shown) so that in case of tin particles, solidification and accumulating is avoided at the profile of the catch 12. Further, the catch 12 comprises a drain 27 and a tin collection vessel 28 to collect the contamination particles. The vessel 28 can periodically be replaced. The radial end portion 15 of the catch profile is located at a distance d1 from the radial end surface of the RFT element, thereby providing a volume 16 for contaminant particles to flow between said catch end portion 15 and said RFT end surface towards the drain 27. Since the RFT is located in a vacuum, a major vacuum resistance is required to keep an Argon bas barrier in the RFT. Therefore, the distance d1 is relatively small.

According to an embodiment of the invention, it has been observed that tin particles hitting the catch 12 may generate secondary droplets that are not collected by the catch. When being ejected from a RFT foil, the tin particles have a large tangential speed component, so that the tin liquid surface on the catch 12 is hit under a grazing angle. It appears that secondary droplets are generated having a different trajectory than the primary droplets. As an example, the secondary droplets may enter a static foil trap that may also be located in the radiation beam path. Upon entrance of the static foil trap, the tin particles may cause problems including the forming of thermal shorts between the heated catch 12 and a cooled static foil trap, and the crash of a foil trap.

Figure 4:
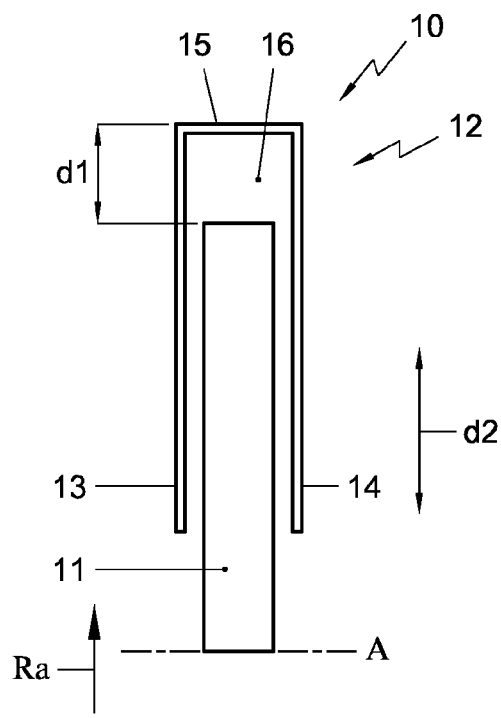
FIG. 4 depicts a schematic cross sectional view of a rotation contaminant trap of a radiation system according to an embodiment of the invention.

FIG. 4 depicts a schematic cross sectional view of a rotation contaminant trap 10 of a radiation system according to a first embodiment of the invention. The RFT 10 comprises again a ring-shaped open channel-like catch structure 12 wherein its side portions 13, 14 have been extended in the radial direction Ra thereby enlarging the volume 16 that is available to catch the contaminant particles. Further, the catch 12 is not heated. Experiments have shown that hardly any secondary particles are generated when hitting and solidifying on a relatively cold catch surface. The primary particles are retained by the catch without entering the static foil trap. Since the (accumulation) volume 16 has increased in view of the prior art volume, solidified particles may accumulate to some extend without hitting the foils 11. After a predetermined number of source shots, e.g., circa 10 Gshots, the catch 12 may be replaced or cleaned to remove the accumulated contaminant particles. A cleaning operation can e.g., be performed by temporarily heating the catch 12. Preferably, the RFT foils are also extended in the radial direction Ra so that a lost vacuum resistance over the axial dimension of the foils is mainly compensated by additional resistance between the sides of the foils and the extended catch side portions 13, 14. More specifically, an additional vacuum resistance may than be generated over a distance d2 along the catch side portions 13, 14, see FIG. 4. The accumulation space 16 provides that the contaminant catch 12 has a constitution, during operation of the radiation system, for retaining said contaminant material particles, thereby counteracting that the particles re-enter the radiation beam path and/or a contaminant trap.

Figure 5:
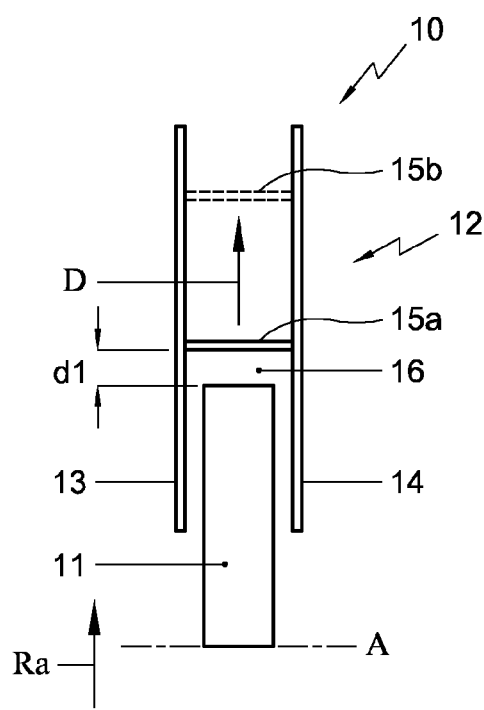
FIG. 5 depicts a schematic cross sectional view of a rotation contaminant trap of a radiation system according to an embodiment of the invention.

FIG. 5 depicts a schematic cross sectional view of a rotation contaminant trap 10 of a radiation system according to a second embodiment of the invention. Here, the radial end portion 15 is movable in the radial direction Ra. More specifically, the radial end portion 15 can be moved from a smaller radial inner position 15a along a moving path D towards a larger radial inner position 15b thereby increasing the distance d1 and the accumulation space 16 between the foil ends and the catch radial end portion 15. The movable radial end portion 15 can e.g., be realized by using a flexible metal material and a pressure cylinder with spring to slowly move the portion 15. Preferably, the radial end portion is cooled during operation of the radiation system while the side portions 13, 14 are heated to avoid mechanical connections between the end portion 15 and the side portions 13, 14 to occur.

Figure 6:
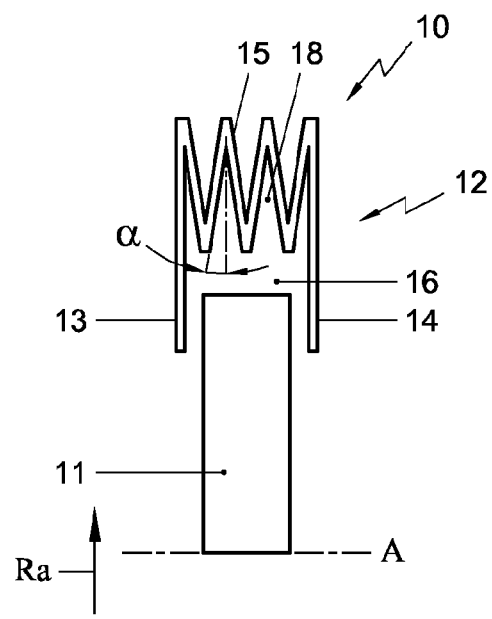
FIG. 6 depicts a schematic cross sectional view of a rotation contaminant trap of a radiation system according to an embodiment of the invention.

FIG. 6 depicts a schematic cross sectional view of a rotation contaminant trap 10 of a radiation system according to a third embodiment of the invention wherein the radiation system comprises a heating device (not shown) for heating the contaminant catch 12 and wherein the radial end portion 15 of the catch profile comprises segments 18 that are oriented nearly parallel to the radial direction Ra, thus forming steep slopes like optical beam dumps. Preferably, the angle α between said segments and the radial direction does not exceed circa 45°, more preferably said angle α does not exceed a smaller angle, e.g., approximately 20° or less. By providing the radial end portion 15 of the catch 12 with nearly radially oriented segments 18, the secondary droplets that may be generated by the primary droplets will generally flow radially outwardly, so that also the secondary droplets can be caught, optionally after multiple reflections against the catch surface, and retained by the catch 12. Then, the droplets may flow via a drain to a collection vessel. It is noted that, in principle, instead of a zigzag counter also another can be applied, such as a harmonic profile.

Figure 7:
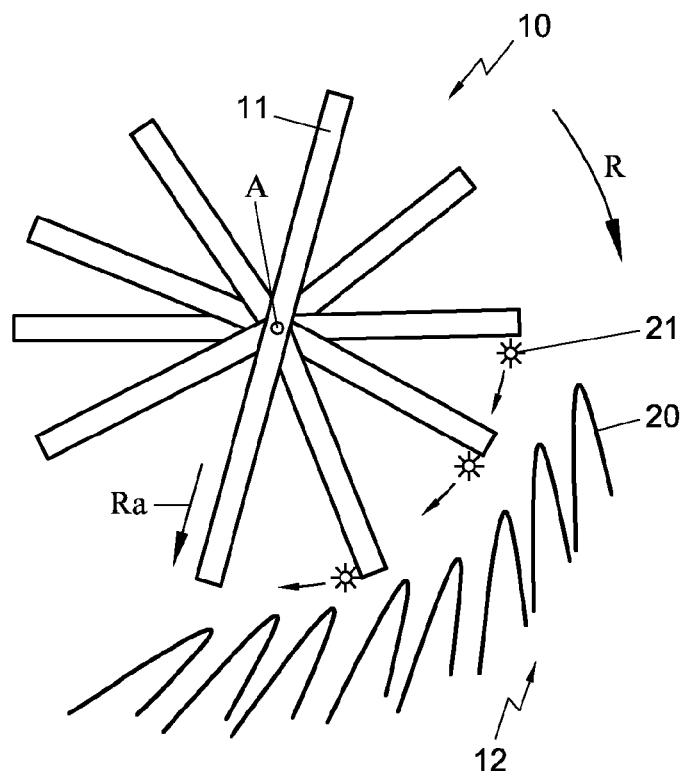
FIG. 7 depicts a schematic cross sectional view of a rotation contaminant trap of a radiation system according to an embodiment of the invention.

FIG. 7 depicts a schematic cross sectional view of a rotation contaminant trap 10 of a radiation system according to a fourth embodiment of the invention. The view is similar to the view of Fig. In the fourth embodiment, the radial end portion of the catch profile comprises a cone like contour 20, thereby minimizing a chance that a primary droplet 21 generates a secondary droplet that might escape from the catch 12. Thereto, the cone orientation nearly coincides with the tangential direction of the foils 11. The catch 12 thus has a constitution, during operation of the radiation system, for retaining the contaminant material particles. Again, it is noted that also other contours can be applied, such as a tooth like contour or a needle contour.

Figure 8:
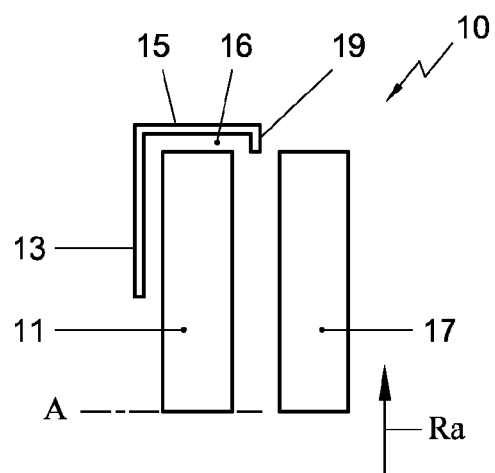
FIG. 8 depicts a schematic cross sectional view of a rotation contaminant trap of a radiation system according to an embodiment of the invention.
Figure 9:
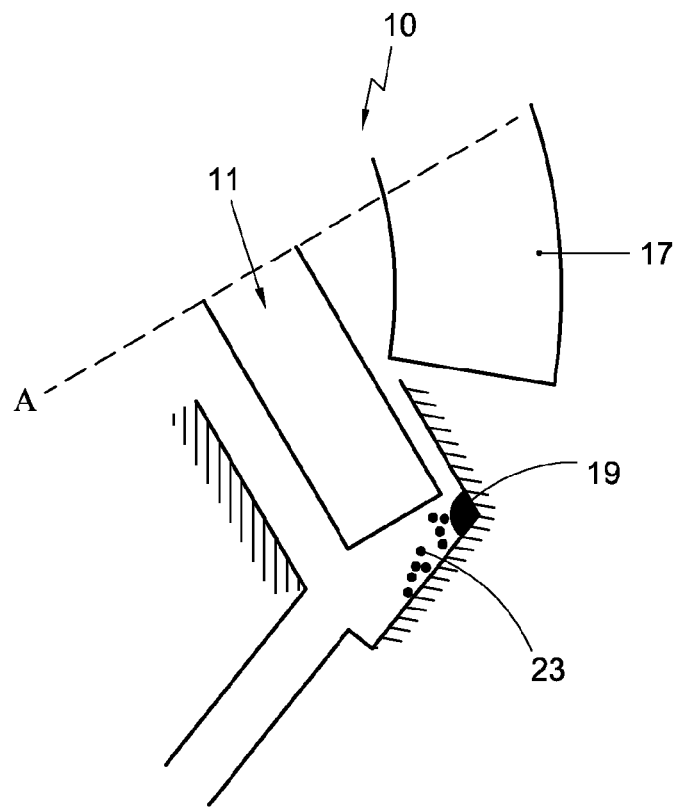
FIG. 9 depicts a schematic perspective view of the rotation contaminant trap of FIG. 8 according to an embodiment of the invention.

FIG. 8 depicts a schematic cross sectional view of a rotation contaminant trap 10 of a radiation system according to a fifth embodiment of the invention, while FIG. 9 depicts a schematic perspective view of the rotation contaminant trap 10. Here, the radiation system further comprises a static contaminant trap 17 that remains static during operation of the radiation system. The static contaminant trap 17 is also arranged in the path of the radiation beam for trapping material emanating from the radiation source. The side portion 14 of the profile facing the static contamination trap forms a rim 19 having a shorter radial length than the other profile side portion 13, thereby counteracting that secondary droplets enter the static contaminant trap 17. FIG. 9 depicts an amount of solidified contaminant particles 23. Since the rim 19 is preferably heated, entrance of accumulated particles in the static foil trap is counteracted.

It is noted that not only the embodiment shown in FIGS. 8 and 9 can be provided with a static contaminant trap. Also other embodiments can be provided with a static contaminant trap.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional storing blocks illustrating the implementation of specified functions and relationships thereof. The boundaries of these functional storing blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A lithographic apparatus comprising:
   a radiation system for providing a beam of radiation from radiation emitted by a radiation source, the radiation system having
      a rotation contaminant trap arranged in the path of the radiation beam to trap material emanating from the radiation source, the rotation contaminant trap having a multiple number of elements extending in a radial direction from a common rotation trap axis and being arranged to allow contaminant material emanating from the radiation source to deposit during propagation of the radiation beam, and
      a contaminant catch configured to receive contaminant material particles from the multiple number of elements and to collect the contaminant material particles, wherein the contaminant catch comprises a profile having side portions extending substantially mutually parallel and in the radial direction with respect to the common rotation trap axis and a radial end portion interconnecting the side portions, and wherein the radial end portion of the profile is movable in the radial direction;
   an illumination system configured to condition the radiation beam;
   a support constructed to support a patterning device, the patterning device being capable of imparting the radiation beam with a pattern in its cross-section to form a patterned radiation beam;
   a substrate table constructed to hold a substrate; and
   a projection system configured to project the patterned radiation beam onto a target portion of the substrate.

2. An apparatus according to claim 1, wherein the radiation system comprises a cooling device to cool the contaminant catch, and wherein the profile and radial end portions of the multiple number of elements define an accumulation space to accumulate solid contaminant catch particles.

3. An apparatus according to claim 2, wherein radial length of the multiple number of elements substantially compensates a vacuum resistance between axial end portions of the multiple number of elements and the radial end portion of the profile of the contaminant catch.

4. A lithographic apparatus comprising:
   a radiation system for providing a beam of radiation from radiation emitted by a radiation source, the radiation system having
      a rotation contaminant trap arranged in the path of the radiation beam to trap material emanating from the radiation source, the rotation contaminant trap having a multiple number of elements extending in a radial direction from a common rotation trap axis and being arranged to allow contaminant material emanating from the radiation source to deposit during propagation of the radiation beam,
      a contaminant catch configured to receive contaminant material particles from the multiple number of elements and to collect the contaminant, material particles, wherein the contaminant catch comprises a profile having side portions extending substantially mutually parallel and in the radial direction with respect to the common rotation trap axis and a radial end portion interconnecting the side portions, wherein the radial end portion of the profile comprises segments that are oriented nearly parallel to the radial direction, and
      a heating device to heat the contaminant; and
   an illumination system configured to condition the radiation beam;
   a support constructed to support a patterning device, the patterning device being capable of imparting the radiation beam with a pattern in its cross-section to form a patterned radiation beam;
   a substrate table constructed to hold a substrate; and
   a projection system configured to project the patterned radiation beam onto a target portion of the substrate.

5. An apparatus according to claim 4, wherein the angle between said segments and the radial direction does not exceed circa 45°.

6. An apparatus according to claim 4, wherein the radial end portion of the profile comprises a zigzag contour.

7. An apparatus according to claim 4, wherein the radial end portion of the profile comprises a tooth like, needle like or cone like contour.

8. A lithographic apparatus comprising:
- a radiation system for providing a beam of radiation from radiation emitted by a radiation source, the radiation system having
  - a rotation contaminant trap arranged in the path of the radiation beam to trap material emanating from the radiation source, the rotation contaminant trap having a multiple number of elements extending in a radial direction from a common rotation trap axis and being arranged to allow contaminant material emanating from the radiation source to deposit during propagation of the radiation beam, and
  - a contaminant catch configured to receive contaminant material particles from the multiple number of elements and to collect the contaminant material particles, wherein the contaminant catch comprises profile having side portions extending substantially mutually parallel and in the radial direction with respect to the common rotation trap axis and a radial end portion interconnecting the side portions, and
  - a static contaminant trap arranged in the path of the radiation beam to trap material emanating from the radiation source, wherein a side portion of the profile facing the static contamination trap forms a rim having a shorter radial length than the other profile side portion;
- an illumination system configured to condition the radiation beam;
- a support constructed to support a patterning device, the patterning device being capable of imparting the radiation beam with a pattern in its cross-section to form a patterned radiation beam;
- a substrate table constructed to hold a substrate; and
- a projection system configured to project the patterned radiation beam onto a target portion of the substrate.

9. An apparatus according to claim 8, wherein the radiation system further comprises a heating device for heating the rim.

10. A radiation system for providing a beam of radiation from radiation emitted by a radiation source, the radiation system, comprising:
- a rotation contaminant trap arranged in the path of the radiation beam for trapping material emanating from the radiation source, the rotation contaminant trap having a multiple number of elements extending in a radial direction from a common rotation trap axis and being arranged to allow contaminant material emanating from the radiation source to deposit during propagation of the radiation beam; and
- a contaminant catch configured to receive contaminant material particles from the multiple number of elements and to collect the contaminant material particles, wherein the contaminant catch comprises a profile having side portions extending substantially mutually parallel and in the radial direction with respect to the common rotation trap axis and a radial end portion interconnecting the side portions, and wherein the radial end portion of the profile is movable in the radial direction.

11. A device manufacturing method comprising:
emitting radiation from radiation source;
forming a beam of radiation from the emitted radiation at a radiation system;
trapping material emanating from the radiation source in a rotation contaminant trap, the rotation contaminant trap comprising a multiple number of elements extending in a radial direction from a common rotation trap axis and being arranged to allow contaminant material emanating from the radiation source to deposit during propagation of the radiation beam;
receiving, at a contaminant catch, contaminant material particles from the multiple number of elements and collecting the contaminant material particles, wherein the contaminant catch comprises a profile having side portions extending substantially mutually parallel and in the radial direction with respect to the common rotation trap axis and a radial end portion interconnecting the side portions, and wherein the radial end portion of the profile is movable in the radial direction;
conditioning the radiation beam;
supporting a patterning device;
imparting the radiation beam with a pattern in its cross-section using the patterning device to form a patterned radiation beam;
holding a substrate on a substrate table; and
projecting the patterned radiation beam onto a target portion of the substrate.

12. A radiation generating method, comprising:
emitting radiation from radiation source;
forming a beam of radiation from the emitted radiation at a radiation system;
trapping material emanating from the radiation source at a contaminant trap in a radiation system for, the rotation contaminant trap comprising a multiple number of elements extending in a radial direction from a common rotation trap axis and being arranged to allow contaminant material emanating from the radiation source to deposit during propagation of the radiation beam; and
receiving contaminant material particles from the contaminant trap multiple number of elements in a contaminant catch and collecting the contaminant material particles, wherein the contaminant catch comprises a profile having side portions extending substantially mutually parallel and in the radial direction with respect to the common rotation trap axis and a radial end portion interconnecting the side portions, and wherein the radial end portion of the profile is movable in the radial direction.

* * * * *

UNITED STATES PATENT AND TRADEMARK OFFICE
CERTIFICATE OF CORRECTION

PATENT NO.         : 8,736,806 B2                                   Page 1 of 1
APPLICATION NO.    : 13/132427
DATED              : May 27, 2014
INVENTOR(S)        : Frijns et al.

It is certified that error appears in the above-identified patent and that said Letters Patent is hereby corrected as shown below:

In the Claims

In column 12, line 46, claim 4, after "contaminant", delete ",".
In column 12, line 55, claim 4, after "contamination", please insert --catch--.
In column 13, line 21, claim 8, after "comprises", please insert --a--.
In column 14, lines 46-47, claim 12, after "from the", please delete "contaminant trap".

Signed and Sealed this
Twenty-first Day of October, 2014

Michelle K. Lee
*Deputy Director of the United States Patent and Trademark Office*